(12) United States Patent
Song

(10) Patent No.: US 10,529,411 B2
(45) Date of Patent: Jan. 7, 2020

(54) BUFFER CIRCUIT, SEMICONDUCTOR APPARATUS AND SYSTEM USING THE SAME

(71) Applicant: SK hynix Inc., Icheon-si, Gyeonggi-do (KR)

(72) Inventor: Hong Joo Song, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/632,675

(22) Filed: Jun. 26, 2017

(65) Prior Publication Data

US 2018/0144785 A1 May 24, 2018

(30) Foreign Application Priority Data

Nov. 24, 2016 (KR) .......................... 10-2016-0157265

(51) Int. Cl.
*G11C 11/4093* (2006.01)
*G11C 7/10* (2006.01)
*G11C 5/14* (2006.01)

(52) U.S. Cl.
CPC .......... *G11C 11/4093* (2013.01); *G11C 5/147* (2013.01); *G11C 7/1006* (2013.01); *G11C 7/106* (2013.01); *G11C 7/1051* (2013.01); *G11C 7/1072* (2013.01); *G11C 7/1078* (2013.01); *G11C 7/1084* (2013.01); *G11C 7/1093* (2013.01)

(58) Field of Classification Search
CPC ... G11C 11/4093; G11C 5/147; G11C 7/1006; G11C 7/1051; G11C 7/106; G11C 7/1078; G11C 7/1093

USPC ..................................................... 365/230.03
See application file for complete search history.

(56) References Cited

U.S. PATENT DOCUMENTS

| | | | | | |
|---|---|---|---|---|---|
| 4,965,468 | A | * | 10/1990 | Nicollini | H03F 3/45192 327/208 |
| 5,854,562 | A | * | 12/1998 | Toyoshima | G11C 7/065 327/55 |
| 5,963,064 | A | * | 10/1999 | Toyota | G05F 1/561 327/103 |
| 5,977,798 | A | * | 11/1999 | Zerbe | H03K 3/356121 326/115 |
| 6,114,881 | A | * | 9/2000 | Eum | G11C 7/067 327/179 |
| 6,147,514 | A | * | 11/2000 | Shiratake | G11C 7/06 327/55 |
| 6,194,933 | B1 | * | 2/2001 | Ishino | H03K 5/135 327/141 |
| 6,232,800 | B1 | * | 5/2001 | Hirairi | G11C 7/065 327/52 |

(Continued)

OTHER PUBLICATIONS

Masaya Miyahara et al., IEEE Asian Solid-State Circuits Conference, "A Low-Noise Self-Calibrating Dynamic Comparator for High-Speed ADCs", Nov. 3-5, 2008, pp. 269-272, IEEE, Fukuoka, Japan.

*Primary Examiner* — Sung Il Cho
(74) *Attorney, Agent, or Firm* — William Park & Associates Ltd.

(57) ABSTRACT

A buffer circuit may include first amplifier coupled to a first common node. The buffer circuit may include a second amplifier coupled to the first common node. The voltage level of the first common node may be changed according to a clock signal.

18 Claims, 3 Drawing Sheets

(56) References Cited

U.S. PATENT DOCUMENTS

| | | | | |
|---|---|---|---|---|
| 6,366,130 B1* | 4/2002 | Podlesny | ............... | G11C 7/065 |
| | | | | 326/86 |
| 6,717,448 B2* | 4/2004 | Heo | ................ | H03K 3/356139 |
| | | | | 327/202 |
| 6,888,380 B2* | 5/2005 | Aoki | ...................... | G11C 27/02 |
| | | | | 327/57 |
| 8,810,282 B2* | 8/2014 | Li | ........................... | H03G 3/00 |
| | | | | 327/54 |
| 8,975,949 B2* | 3/2015 | Berzins | .................. | H03K 3/356 |
| | | | | 327/399 |
| 2003/0091183 A1* | 5/2003 | Holcombe | ........... | H04B 14/026 |
| | | | | 379/399.01 |
| 2007/0236258 A1* | 10/2007 | Kiziloglu | ................ | G11C 7/062 |
| | | | | 327/55 |
| 2008/0054949 A1* | 3/2008 | Pera | .................... | H03F 3/45183 |
| | | | | 327/65 |
| 2008/0303504 A1* | 12/2008 | Kang | ........................ | G05F 3/30 |
| | | | | 323/313 |
| 2009/0027086 A1* | 1/2009 | Trifonov | .............. | H03K 3/3565 |
| | | | | 327/66 |
| 2011/0316587 A1* | 12/2011 | Singh | ..................... | H03K 3/012 |
| | | | | 327/65 |
| 2013/0156126 A1* | 6/2013 | Chung, II | ............... | H04L 27/06 |
| | | | | 375/268 |
| 2014/0312971 A1* | 10/2014 | Kim | .................... | H03F 3/45188 |
| | | | | 330/253 |
| 2014/0355354 A1* | 12/2014 | Ahn | ........................ | G11C 16/26 |
| | | | | 365/185.21 |
| 2015/0055422 A1* | 2/2015 | Kim | ......................... | G11C 8/08 |
| | | | | 365/189.07 |

* cited by examiner

BUFFER CIRCUIT, SEMICONDUCTOR APPARATUS AND SYSTEM USING THE SAME

CROSS-REFERENCES TO RELATED APPLICATION

The present application claims priority under 35 U.S.C. § 119(a) to Korean application number 10-2016-0157265, filed on Nov. 24, 2016, in the Korean Intellectual Property Office, which is incorporated herein by reference in its entirety.

BACKGROUND

1. Technical Field

Various embodiments may generally relate to a semiconductor technology, and more particularly, to a buffer circuit and a semiconductor apparatus and system using the buffer circuit is and or the semiconductor apparatus.

2. Related Art

An electronic device may include a large number of electronic components, and a large part of the electronic components may be implemented with a computer system semiconductor. Semiconductor apparatuses constituting a computer system may transmit a signal in synchronization with a clock, and receive a transmitted signal in synchronization with the clock. The semiconductor apparatuses may include a transmitter for transmitting a signal to another semiconductor apparatus and a receiver for receiving a signal from another semiconductor apparatus. The current development trend of computer systems and semiconductor apparatuses is to improve operating speeds while reducing power consumption. With the improvement in operating speeds of the system, the speed of a clock has been continuously increased, and the amplitudes of a clock signal and transmitted signal have been reduced. Therefore, there is a demand for a receiver and/or buffer capable of accurately receiving a signal, according to the recent technology trends.

SUMMARY

In accordance with an embodiment of the present disclosure, a buffer circuit may be provided. The buffer circuit may include a first amplifier configured to generate first and second intermediate output signals by amplifying first and second input signals. The buffer circuit may include a first driver coupled to the first amplifier through a first common node, and configured to drive the first common node based on a clock signal. The buffer circuit may include a second amplifier configured to generate first and second output signals by amplifying the first and second intermediate output signals. The buffer circuit may include a second driver coupled to the first common node, and configured to enable the second amplifier based on a signal outputted from the first common node.

In accordance with an embodiment of the present disclosure, a buffer circuit may include a common node driver configured to change a voltage level of a first common node based on a clock signal. The buffer circuit may include a first amplifier coupled to the first common node, and configured to generate first and second intermediate output signals by amplifying first and second input signals based on the clock signal. The buffer circuit may include a second amplifier configured to generate first and second output signals by amplifying the first and second intermediate output signals. The buffer circuit may include a second driver coupled to the first common node, and configured to enable the second amplifier based on a signal outputted from the first common node.

In accordance with an embodiment of the present disclosure, a buffer circuit may include a first transistor configured to drive a first common node to a first supply voltage based on a clock signal. The buffer circuit may include a first amplifier coupled between the first common node and a second supply voltage, and configured to generate first and second intermediate output signals by amplifying first and second input signals based on the clock signal. The buffer circuit may include a second transistor configured to drive the second common node to the second supply voltage based on a signal outputted from the first common node. The buffer circuit may include a second amplifier coupled between the second common node and the first supply voltage, and configured to generate first and second output signals by amplifying the first and second intermediate output signals.

In accordance with an embodiment of the present disclosure, a buffer circuit may include a first amplifier circuit coupled to a first common node and configured to operate based on a clock signal. The buffer circuit may include a second amplifier circuit configured to operate based on a voltage level of the first common node. The voltage level of the first common node may be changed according to the clock signal.

DETAILED DESCRIPTION

Hereinafter, a buffer circuit and a semiconductor apparatus and system using the same according to the present disclosure will be described below with reference to the accompanying drawings through examples of embodiments.

Figure 1:
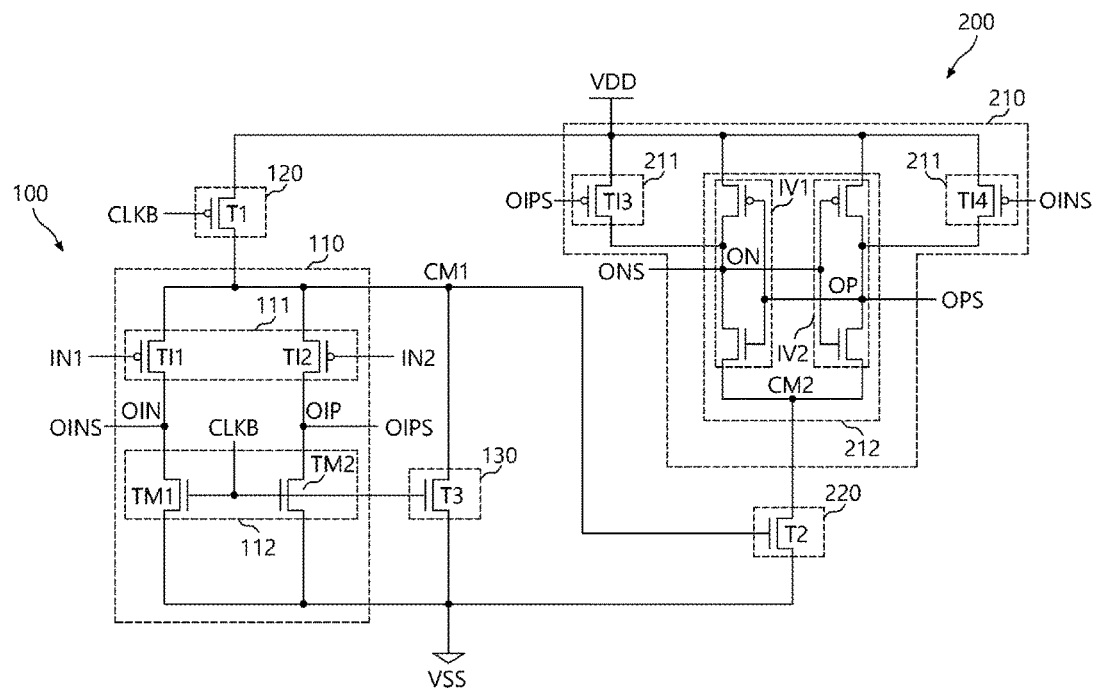
FIG. 1 is a diagram illustrating a configuration of a buffer circuit according to an embodiment.

FIG. 1 is a diagram illustrating a configuration of a buffer circuit 1 according to an embodiment. Referring to FIG. 1, the buffer circuit 1 may include, for example but not limited to, two amplifier circuits. The two amplifier circuits may operate based on one clock signal, and operate at different timings. The buffer circuit 1 may have, for example but not limited to, a double-tail latch structure. The buffer circuit 1 may include first and second amplifier circuits 100 and 200. The first amplifier circuit 100 may receive a clock signal CLKB, a first input signal IN1 and a second input signal IN2. The first amplifier circuit 100 may generate first and second intermediate output signals OIPS and OINS by amplifying the first and second input signals IN1 and IN2 based on the clock signal CLKB. In an embodiment, the second input signal IN2 may serve as a reference voltage. For example, the reference voltage may have a voltage level corresponding to the middle of the swing of the first input signal IN1. In an embodiment, the second input signal IN2 may correspond to a differential signal of the first input signal IN1.

The first amplifier circuit 100 may include a first amplifier 110 and a first driver 120. The first amplifier 110 may generate the first and second intermediate output signals OIPS and OINS by amplifying the first and second input signals IN1 and IN2 based on the clock signal CLKB. The first amplifier 110 may be enabled in response to the clock signal CLKB, and perform an amplification operation. The first driver 120 may be coupled to a first common node CM1, and drive the first common node CM1 based on the clock signal CLKB. The first driver 120 may drive the first common node CM1 to a first supply voltage VDD in response to the clock signal CLKB. The first amplifier 110 may be coupled between the first common node CM1 and a second supply voltage VSS terminal. The first supply voltage VDD may have a higher voltage level than the second supply voltage VSS. For example, the first supply voltage VDD may be set to a high voltage, and the second supply voltage VSS may be set to a low voltage having a lower voltage level than the high voltage. The low voltage may correspond to a ground voltage, for example.

The second amplifier circuit 200 may include a second amplifier 210 and a second driver 220. The second amplifier 210 may generate first and second output signals OPS and ONS by amplifying the first and second intermediate output signals OIPS and OINS. The second amplifier 210 may be coupled between the first supply voltage terminal VDD and a second common node CM2. The second driver 220 may be coupled to the first common node CM1. The second driver 220 may enable the second amplifier 210 based on a signal outputted from the first common node CM1. The second driver 220 may drive the second common node CM2 to the second supply voltage VSS in response to the signal outputted from the first common node CM1. The second amplifier 210 may perform an amplification and/or latch operation when the second supply voltage VSS is supplied through the second common node CM2 by the second driver 220.

The first amplifier 110 may include a first input unit 111 and a current driver 112. The first input unit 111 may be coupled between the first common node CM1 and first and second intermediate output nodes OIP and OIN. The first input unit 111 may receive the first and second input signals IN1 and IN2, and change the voltage levels of the first and second intermediate output nodes OIP and OIN. The first intermediate output signal OIPS may be outputted from the first intermediate output node OIP, and the second intermediate output signal OINS may be outputted from the second intermediate output node OIN. The current driver 112 may be coupled between the first and second intermediate output nodes OIP and OIN and the second supply voltage terminal VSS. The current driver 112 may enable the first amplifier 110 based on the clock signal CLKB. The current driver 112 may couple the first and second intermediate output nodes OIP and OIN to the second supply voltage VSS terminal.

The first input unit 111 may include a first input transistor TI1 and a second input transistor TI2. For example, the first and second input transistors TI1 and TI2 may include, for example but not limited to, P-channel MOS transistors. The first input transistor TI1 may have a gate configured to receive the first input signal IN1, a source coupled to the first common node CM1, and a drain coupled to the second intermediate output node OIN. The second input transistor TI2 may have a gate configured to receive the second input signal IN2, a source coupled to the first common node CM1, and a drain coupled to the first intermediate output node OIP. The current driver 112 may include a first driver transistor TM1 and a second driver transistor TM2. For example, the first and second driver transistors TM1 and TM2 may include, for example but not limited to, N-channel MOS transistors. The first driver transistor TM1 may have a gate configured to receive the clock signal CLKB, a drain coupled to the second intermediate output node OIN, and a source coupled to the second supply voltage VSS terminal. The second driver transistor TM2 may have a gate configured to receive the clock signal CLKB, a drain coupled to the first intermediate output node OIP, and a source coupled to the second supply voltage VSS terminal.

The first driver 120 may include a first transistor T1. For example, the first transistor T1 may include, for example but not limited to, a P-channel MOS transistor. The first transistor T1 may have a gate configured to receive the clock signal CLKB, a source coupled to the first supply voltage VDD, and a drain coupled to the first common node CM1.

The second amplifier 210 may include a second input unit 211 and a latch unit 212. The second input unit 211 may be coupled between the first supply voltage VDD terminal and first and second output nodes OP and ON. The second input unit 211 may receive the first and second intermediate output signals OIPS and OINS, and change the voltage levels of the first and second output nodes OP and ON. The first output signal OPS may be outputted from the first output node OP, and the second output signal ONS may be outputted from the second output node ON. The latch unit 212 may generate the first and second output signals OPS and ONS by latching the voltage levels of the first and second output nodes OP and ON.

The second input unit 211 may include a third input transistor TI3 and a fourth input transistor TI4. For example, the third and fourth input transistors TI3 and TI4 may include, for example but not limited to, P-channel MOS transistors. The third input transistor TI3 may have a gate configured to receive the first intermediate output signal OIPS, a source coupled to the first supply voltage terminal VDD, and a drain coupled to the second output node ON. The fourth input transistor TI4 may have a gate configured to receive the second intermediate output signal OINS, a source coupled to the first supply voltage terminal VDD, and a drain coupled to the first output node OP. The latch unit 212 may include a first inverter IV1 and a second inverter IV2. The first inverter IV1 may be coupled between the first supply voltage VDD terminal and the second common node CM2. The first inverter IV1 may have an input terminal coupled to the first output node OP and an output terminal coupled to the second output node ON. The second inverter IV2 may be coupled between the first supply voltage VDD terminal and the second common node CM2. The second inverter IV2 may have an input terminal coupled to the second output node ON and an output terminal coupled to the first output node OP. The P-channel MOS transistor of the first inverter IV1 may have a source coupled to the first supply voltage VDD terminal, a gate coupled to the first output node OP, and a drain coupled to the second output node ON. The N-channel MOS transistor of the first inverter IV1 may have a source coupled to second common node CM2, a drain coupled to the second output node ON, and a gate coupled to the first output node OP. The P-channel MOS transistor of the second inverter IV2 may have a source coupled to the first supply voltage VDD terminal, a drain coupled to the first output node OP, and a gate coupled to the second output node ON. The N-channel MOS transistor of the second inverter IV2 may have a source coupled to second common node CM2, a gate coupled to the second output node ON, and a drain coupled to first output node OP.

The second driver 220 may include a second transistor T2. For example, the second transistor T2 may include an N-channel MOS transistor. The second transistor T2 may have a gate coupled to the first common node CM1 to receive a signal outputted from the first common node CM1, a drain coupled to the second common node CM2, and a source coupled to the second supply voltage terminal VSS.

The buffer circuit 1 may further include an auxiliary driver 130. The auxiliary driver 130 may drive the first common node CM1 based on the clock signal CLKB. The auxiliary driver 130 may operate at a different timing from the first driver 120. The auxiliary driver 130 may drive the first common node CM1 to a different level from the first driver 120. The auxiliary driver 130 may drive the first common node CM1 to the second supply voltage VSS in response to the clock signal CLKB. The auxiliary driver 130 may include a third transistor T3. The third transistor T3 may have a gate configured to receive the clock signal CLKB, a drain coupled to the first common node CM1, and a source coupled to the second supply voltage terminal VSS. As described above, the first transistor T1 constituting the first driver 120 may include a P-channel MOS transistor, but the third transistor T3 constituting the auxiliary driver 130 may include an N-channel MOS transistor. Therefore, when the clock signal CLKB is at a high level, the auxiliary driver 130 may be operated, and when the clock signal CLKB is at a low level, the first driver 120 may be operated. When the clock signal CLKB is at a low level, the first driver 120 may drive the first common node CM1 to the level of the first supply voltage VDD. Since the first transistor T1 is turned off when the clock signal CLKB is at a high level, the first common node CM1 may be set in a floating state. In order to prevent the first common node CM1 from floating, the auxiliary driver 130 may drive the first common node CM1 to the level of the second supply voltage VSS when the clock signal CLKB is at a high level. Therefore, the first driver 120 and the auxiliary driver 130 may function as a common node driver. The common node driver may change the voltage level of the first common node CM1 based on the clock signal CLKB, and drive the first common node CM1 to one of the first and second supply voltages VDD and VSS based on the clock signal CLKB. Through the common node driver, a signal outputted from the first common node CM1 may have the opposite phase of the clock signal CLKB.

Figure 2:
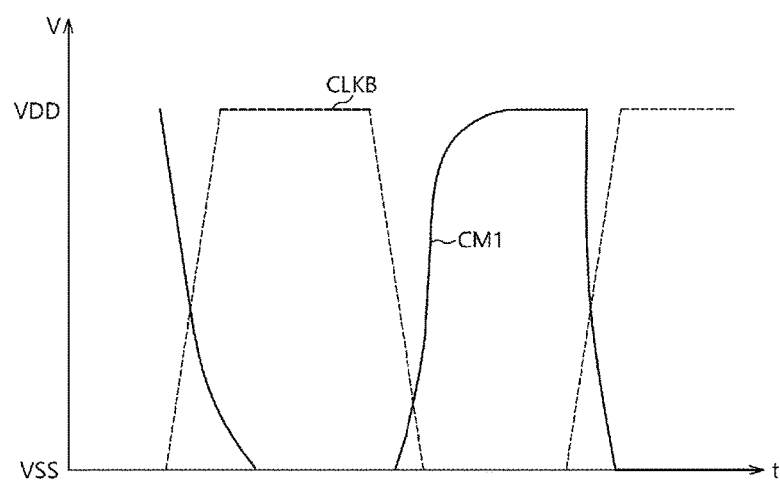
FIG. 2 is a timing diagram illustrating the waveforms of a clock signal and a signal outputted from a first common node.

FIG. 2 is a timing diagram illustrating the waveforms of the clock signal CLKB and the signal outputted from the first common node CM1. Referring to FIGS. 1 and 2, the operation of the buffer circuit 1 in accordance with a present embodiment will be described as follows. In FIG. 2, the x-axis may indicate a time t, and the y-axis may indicate a voltage level V. The clock signal CLKB may toggle between the first and second supply voltages VDD and VSS. While the clock signal CLKB is at a low level, the first common node CM1 may be driven to a high level by the first driver 120, and while the clock signal CLKB is at a high level, the first common node CM1 may be driven to a low level by the auxiliary driver 130.

When the clock signal CLKB is at a high level, the first transistor T1 may be turned off, and the third transistor T3 may be turned on to change the first common node CM1 to a low level. Thus, the second transistor T2 may be turned off according to the voltage level of the first common node CM1. When the clock signal CLKB is at a high level, the first and second driver transistors TM1 and TM2 constituting the current driver 112 may be turned on, and the first amplifier 110 may be enabled. The first input unit 111 may change the voltage levels of the first and second intermediate output nodes OIP and OIN depending on a voltage level difference between the first and second input signals IN1 and IN2, and the first and second intermediate output signals OIPS and OINS may be outputted from the first and second intermediate output nodes OIP and OIN. When the clock signal CLKB is changed to a low level, the first transistor T1 may be turned on, and the third transistor T3 may be turned off to change the first common node CM1 to a high level. Thus, the second transistor T2 may be turned on according to the voltage level of the first common node CM1, and the second common node CM2 may be set to a low level. Then, the second amplifier 210 may be enabled. The second input unit 211 may change the voltage levels of the first and second intermediate output nodes OIP and OIN according to the first and second intermediate output signals OIPS and OINS, and the latch unit 212 may generate the first and second output signals OPS and ONS by latching the voltage levels of the first and second output nodes OP and ON.

Both of the first and second amplifier circuits 110 and 210 constituting the buffer circuit 1 may operate based on one clock signal CLKB or a single clock signal CLKB. In a general buffer circuit having a double tail latch structure, a first amplifier may operate based on a clock signal, and a second amplifier may operate based on a complementary clock signal. At this time, when the clock signal and the complementary clock signal have different duties, operation periods of the first and second amplifiers may be different from each other. Thus, the buffer circuit cannot generate a correct output signal. In the buffer circuit 1 according to a present embodiment, the first amplifier circuit 100 may operate based on the clock signal CLKB, and the second amplifier circuit 200 may operate based on the voltage level of the first common node CM1 having a voltage level which is changed according to the clock signal CLKB. Therefore, since the operation periods of the first and second amplifier circuits 100 and 200 are correlated to each other even though the duty of the clock signal CLKB is changed, the buffer circuit 1 can stably generate the output signals OPS and ONS.

Figure 3:
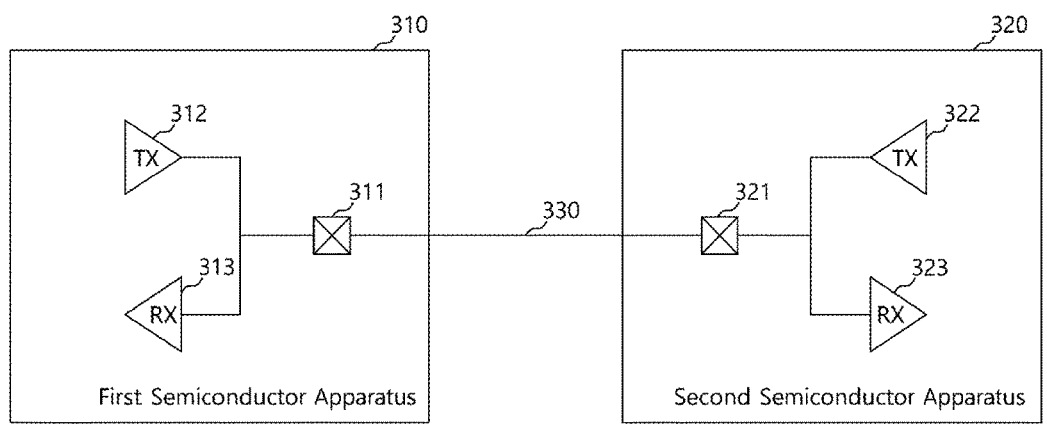
FIG. 3 is a diagram illustrating a configuration of a system according to an embodiment.

The buffer circuit 1 according to the present embodiments may be applied as various components of the semiconductor technology field. FIG. 3 is a diagram illustrating a configuration of a system to which the buffer circuit according to the present embodiments may be applied. Referring to FIG. 3, the system 3 may include first and second semiconductor apparatuses 310 and 320. The first and second semiconductor apparatuses 310 and 320 may serve as electronic components which communicate with each other. In an embodiment, the first semiconductor apparatus 310 may serve as a master device, and the second semiconductor apparatus 320 may serve as a slave device which is controlled and operated by the first semiconductor apparatus 310. For example, the first semiconductor apparatus 310 may serve as a host device such as, for example but not limited to, a processor, and the processor may include a CPU (Central Processing Unit), GPU (Graphic Processing Unit), MMP (Multi-Media Processor) and digital signal processor. Furthermore, processor chips such as an AP (Application Processor), which have various functions, may be combined and implemented in the form of SOC (System On Chip). The second semiconductor apparatus 320 may serve as a memory device, and the memory device may include a nonvolatile memory and a nonvolatile memory. The volatile memory may include, for example but is not limited to, SRAM (Static RAM), DRAM (Dynamic RAM) and SDRAM (Synchronous DRAM), and the nonvolatile memory may include ROM (Read Only Memory), PROM (Programmable ROM), EEPROM (Electrically Erase and Programmable ROM), EPROM (Electrically Programmable ROM), Flash memory, PRAM (Phase change RAM), MRAM (Magnetic RAM), RRAM (Resistive RAM), FRAM (Ferroelectric RAM) and the like.

The first and second semiconductor apparatuses 310 and 320 may be coupled to each other through a signal transmission line 330. The first semiconductor apparatus 310 may include a pad 311, and the pad 311 may be coupled to the signal transmission line 330. The second semiconductor apparatus 320 may include a pad 321, and the pad 321 may be coupled to the signal transmission line 330. The signal transmission line 330 may include a channel, link or bus. The first semiconductor apparatus 310 may include a transmitter (TX) 312 and a receiver (RX) 313. The transmitter 312 may generate an output signal according to an internal signal of the first semiconductor apparatus 310, and transmit the output signal to the second semiconductor apparatus 320 through the signal transmission line 330. The receiver 313 may receive a signal from the second semiconductor apparatus 320 through the signal transmission line 330, and generate an internal signal. Similarly, the second semiconductor apparatus 320 may include a transmitter (TX) 322 and a receiver (RX) 323. The transmitter 322 may generate an output signal according to an internal signal of the second semiconductor apparatus 320, and transmit the output signal to the first semiconductor apparatus 310 through the signal transmission line 330. The receiver 323 may receive a signal from the first semiconductor apparatus 310 through the signal transmission line 330, and generate an internal signal. The receivers 313 and 323 may receive a signal transmitted through the signal transmission line 330 based on a clock signal, and the buffer circuit 1 illustrated in FIG. 1 may be applied as the receivers 313 and 323.

Figure 4:
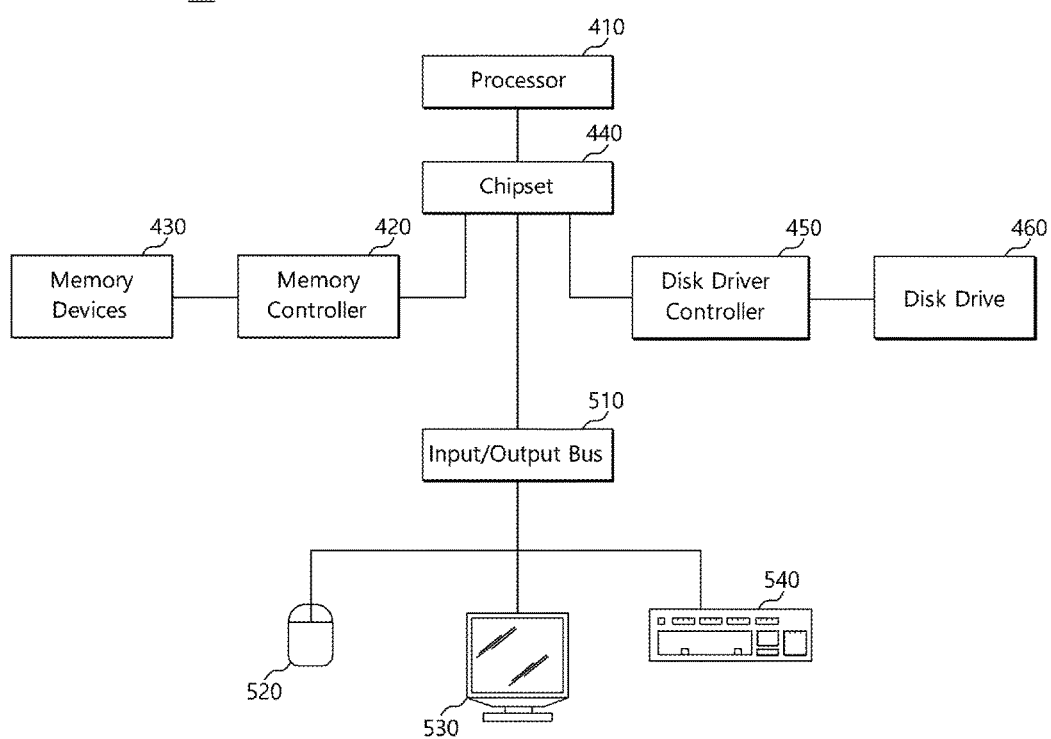
FIG. 4 is a diagram illustrating a configuration of a system according to an embodiment.

FIG. 4 is a diagram illustrating a configuration of a system 4 according to an embodiment. Referring to FIG. 4, the system 4 may include a processor 410, a memory controller 420 and memory devices 430. The processor 410 may be coupled to the memory controller 420 through a chip set 440, and the memory controller 420 may be coupled to the memory devices 430 through a plurality of buses. FIG. 4 illustrates that the system includes one processor 410. However, the present embodiments are not limited thereto, but the system may include a plurality of physical or logical processors. The chip set 440 may provide a communication path through which a signal is transmitted between the processor 410 and the memory controller 420. The processor 410 may perform an arithmetic operation, and transmit a request and data to the memory controller 420 through the chip set 440 in order to input and output (input/output) desired data.

The memory controller 420 may transmit a command signal, address signal, clock signal and data through the plurality of buses. The memory devices 430 may receive the signals from the memory controller 420, store the received signals as data, and output the stored data to the memory controller 420. The memory devices 430 may include, for example but not limited to, a volatile memory such as DRAM or a nonvolatile memory such as a flash memory, PCRAM (Phase Change RAM), ReRAM (Resistive RAM), FeRAM (Ferroelectric RAM), MRAM (Magnetic RAM) or STTRAM (Spin-Torque Transfer RAM). The memory devices 430 may include a combination of two or more memories among the volatile and nonvolatile memories.

Between the processor 410 and the memory controller 420, the processor 410 may serve as a master device, and the memory controller 420 may serve as a slave device. Since the processor 410 and the memory controller 420 transmit and receive (transmit/receive) a request and data to and from (to/from) each other, each of the processor 410 and the memory controller 420 may include a receiver for receiving a signal transmitted from the opposite device. The buffer circuit 1 according to the present embodiments may be applied as the receiver.

Between the memory controller 420 and the memory device 430, the memory controller 420 may serve as a master device, and the memory device 430 may serve as a slave device. Since the memory controller 420 transmits a command signal, address signal, clock signal and data to the memory device 430 and the memory device 430 transmits data to the memory controller 420, each of the memory controller 420 and the memory device 430 may include a receiver for receiving a signal transmitted from the opposite device. The buffer circuit 1 according to the present embodiments may be applied as the receiver.

Referring to FIG. 4, the system 4 may further include an input and output (input/output) bus 510, an input/output device 520, 530 or 540, a disk driver controller 450 and a disk drive 460. The chip set 440 may be coupled to the input/output bus 510. The input/output bus 510 may provide a communication path for signal transmission from the chip set 440 to the input/output device 520, 530 or 540. The input/output device may include a mouse 520, video display 530 or keyboard 540. The input/output bus 510 may include any communication protocols as long as the communication protocols can communicate with the input/output device 520, 530 or 540. The input/output bus 510 may be integrated in the chip set 440.

The disk driver controller 450 may be coupled to the chip set 440. The disk driver controller 450 may provide a communication path between the chip set 440 and one or more disk drives 460. The disk drive 460 may be utilized as an external data storage device for storing a command and data. The disk driver controller 450 and the disk drive 460 may communicate with each other or the chip set 440 through any communication protocols including the input/output bus 510.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A buffer circuit comprising:
   a first amplifier configured to generate first and second intermediate output signals by amplifying first and second input signals;
   a first driver coupled to the first amplifier through a first common node, and configured to drive the first common node based on a clock signal;
   a second amplifier configured to generate first and second output signals by amplifying the first and second intermediate output signals; and
   a second driver directly coupled to the first common node, and configured to enable the second amplifier based on a signal outputted from the first common node.

2. The buffer circuit of claim 1, wherein the first driver comprises a first transistor configured to couple a first supply voltage to the first common node in response to the clock signal.

3. The buffer circuit of claim 2, wherein the first amplifier comprises:
a first input unit coupled between the first common node and first and second intermediate output nodes, and configured to receive the first and second input signals and change voltage levels of the first and second intermediate output nodes; and
a current driver configured to couple the first and second intermediate output nodes to a second supply voltage in response to the clock signal.

4. The buffer circuit of claim 1, wherein the second driver comprises a second transistor configured to couple a second common node and a second supply voltage in response to a signal received through the first common node.

5. The buffer circuit of claim 4, wherein the second amplifier comprises:
a second input unit configured to receive the first and second intermediate output signals and change voltage levels of first and second output nodes; and
a latch unit coupled to the second common node, and configured to generate the first and second output signals by latching the voltage levels of the first and second output nodes.

6. The buffer circuit of claim 1, further comprising an auxiliary driver configured to couple the first common node to a second supply voltage in response to the clock signal.

7. A buffer circuit comprising:
a common node driver configured to change a voltage level of a first common node based on a clock signal;
a first amplifier coupled to the first common node, and configured to generate first and second intermediate output signals by amplifying first and second input signals based on the clock signal;
a second amplifier configured to generate first and second output signals by amplifying the first and second intermediate output signals; and
a second driver directly coupled to the first common node, and configured to enable the second amplifier based on a signal outputted from the first common node.

8. The buffer circuit of claim 7, wherein the common node driver is configured to change a signal outputted from the first common node to have an opposite phase of the clock signal.

9. The buffer circuit of claim 7, wherein the common node driver drives the first common node to one of first and second supply voltages based on the clock signal.

10. The buffer circuit of claim 9, wherein the common node driver comprises:
a first driver configured to drive the first common node to the first supply voltage in response to the clock signal; and
an auxiliary driver configured to drive the first common node to the second supply voltage in response to the clock signal.

11. The buffer circuit of claim 7, wherein the first amplifier comprises:
a first input unit coupled to the first common node, and configured to change voltage levels of first and second intermediate output nodes in response to the first and second input signals; and
a current driver configured to couple the first and second intermediate output nodes to a second supply voltage in response to the clock signal.

12. The buffer circuit of claim 7, wherein the second amplifier comprises:
a second input unit configured to receive the first and second intermediate output signals and change voltage levels of first and second output nodes; and
a latch unit coupled to the second common node, and configured to generate the first and second output signals by latching the voltage levels of the first and second output nodes.

13. A buffer circuit comprising:
a first transistor configured to drive a first common node to a first supply voltage based on a clock signal;
a first amplifier coupled between the first common node and a second supply voltage, and configured to generate first and second intermediate output signals by amplifying first and second input signals based on the clock signal;
a second transistor configured to drive a second common node to the second supply voltage by directly receiving a signal outputted from the first common node; and
a second amplifier coupled between the second common node and the first supply voltage, and configured to generate first and second output signals by amplifying the first and second intermediate output signals.

14. The buffer circuit of claim 13, further comprising a third transistor configured to drive the first common node to the second supply voltage based on the clock signal.

15. The buffer circuit of claim 13, wherein the first amplifier comprises:
a first input unit coupled to the first common node, and configured to change voltage levels of first and second intermediate output nodes in response to the first and second input signals; and
a current driver configured to couple the first and second intermediate output nodes to a second supply voltage in response to the clock signal.

16. The buffer circuit of claim 13, wherein the second amplifier comprises:
a second input unit configured to receive the first and second intermediate output signals and change voltage levels of first and second output nodes; and
a latch unit coupled to the second common node, and configured to generate the first and second output signals by latching the voltage levels of the first and second output nodes.

17. The buffer circuit of claim 13, wherein the second input signal has a voltage level corresponding to a middle of a swing of the first input signal.

18. The buffer circuit of claim 13, wherein the second input signal corresponds to a differential signal of the first input signal.

* * * * *